(12) United States Patent
Meiss et al.

(10) Patent No.: US 8,418,911 B2
(45) Date of Patent: Apr. 16, 2013

(54) METHOD FOR THE MINIATURIZABLE CONTACTING OF INSULATED WIRES

(75) Inventors: Thorsten Meiss, Fuerth Odenwald (DE); Tim Rossner, Alzenau (DE)

(73) Assignee: Roland Werthschutzky, Kleinmachnow (DE)

( * ) Notice: Subject to any disclaimer, the term of this patent is extended or adjusted under 35 U.S.C. 154(b) by 0 days.

(21) Appl. No.: 13/133,848

(22) PCT Filed: Dec. 8, 2009

(86) PCT No.: PCT/DE2009/001723
§ 371 (c)(1),
(2), (4) Date: Aug. 29, 2011

(87) PCT Pub. No.: WO2010/066238
PCT Pub. Date: Jun. 17, 2010

(65) Prior Publication Data
US 2011/0303341 A1    Dec. 15, 2011

(30) Foreign Application Priority Data
Dec. 9, 2008    (DE) .......................... 10 2008 060 862

(51) Int. Cl.
*B23K 1/06* (2006.01)
*B23K 26/20* (2006.01)
*B23K 31/02* (2006.01)

(52) U.S. Cl.
USPC ..................... 228/110.1; 228/170; 228/180.5; 219/121.64

(58) Field of Classification Search ......................... None
See application file for complete search history.

(56) References Cited

U.S. PATENT DOCUMENTS

| 4,952,866 | A | * | 8/1990 | Van Tuijl .................... 323/315 |
| 5,110,032 | A | * | 5/1992 | Akiyama et al. ............. 228/102 |
| 5,283,082 | A | | 2/1994 | Hussmann et al. |
| 5,618,189 | A | * | 4/1997 | Jin et al. ......................... 439/91 |
| 7,045,739 | B2 | | 5/2006 | Dietrich |
| 2001/0035761 | A1 | * | 11/2001 | Ohno ............................ 324/761 |
| 2002/0084093 | A1 | | 7/2002 | Zhang et al. |
| 2007/0262468 | A1 | * | 11/2007 | Nasu et al. .................... 257/778 |
| 2008/0011347 | A1 | * | 1/2008 | Aoyama et al. ............... 136/244 |
| 2008/0116591 | A1 | | 5/2008 | Hayashi et al. |

FOREIGN PATENT DOCUMENTS

| DE | 3312190 C1 | 4/1984 |
| DE | 3642221 A1 | 6/1987 |
| DE | 19535282 A1 | 3/1996 |
| DE | 19605038 A1 | 8/1997 |
| EP | 1 396 915 A1 | 3/2004 |

(Continued)

OTHER PUBLICATIONS

International Search Report for Application No. PCT/DE2009/001723, dated Jul. 20, 2010.

*Primary Examiner* — Kiley Stoner
(74) *Attorney, Agent, or Firm* — Marshall, Gerstein & Borun LLP; Michael P. Furmanek

(57) ABSTRACT

The invention allows for the contacting of preferably microcomponents using electrical wires. By growing metallic microdepositions on cut surfaces of microcables, a contact region is generated which simplifies the dosing and application of a contact auxiliary and allows ultrasonic bonding, comprising a defined size of the electrically conductive area and allowing the contacting of very stably insulated wires. The application of this method in a panelized manner and in series is inexpensive.

12 Claims, 4 Drawing Sheets

FOREIGN PATENT DOCUMENTS

| | | | |
|---|---|---|---|
| GB | 1024540 A | | 3/1966 |
| JP | 62-4331 A | * | 1/1987 |
| JP | 10-149903 A | * | 6/1998 |
| JP | 11031541 A | | 2/1999 |
| JP | 2001-230534 A | | 8/2001 |
| JP | 2003-149265 A | | 5/2003 |

* cited by examiner

METHOD FOR THE MINIATURIZABLE CONTACTING OF INSULATED WIRES

CROSS-REFERENCE TO RELATED APPLICATIONS

This is the U.S. National Phase of International Patent Application No. PCT/DE2009/001723, filed Dec. 8, 2009, which claims priority to German Patent Application No. 10 2008 060 862.9, filed Dec. 9, 2008, the entire contents of each of which are expressly incorporated herein by reference.

FIELD OF THE DISCLOSURE

The present disclosure is directed to contacting of insulated wires.

BACKGROUND

Insulated wires are often used when contacting electrical components. In many products, the trend toward miniaturizing components leads to large savings in terms of material. Due to the small dimensions, the miniaturized components can generally be produced in panelized form; a large number of components are therefore manufactured in parallel on a carrier, resulting in huge cost savings. However, miniaturization also primarily enables the development of new applications through miniaturized components and assemblies.

In medical technology, for example, blood pressure can be determined directly in the coronary vessels by means of very small sensors. Miniaturized actuators are also suitable to be used for transmitting and in turn receiving sound waves in the coronary vessels. Thus, the flow rate of the blood is able to be determined via the shift in frequency. In addition, during catheterization, the reaction force of instruments in the coronary vessels is able to be measured by means of miniaturized force sensors. Further uses of miniaturized electrical components can be found in the aerospace industry, motor vehicle engineering, building services engineering, and the consumer goods industry, as well as in almost all areas of technology in the future.

Microsensors often have to be supplied with energy, and the signals have to be conducted over several meters. For that purpose, electrical wires, often microcables, are advantageously used, particularly in the case of connection lengths greater than 60 cm. In order to protect these wires from short-circuiting with one another and from external influences and to ensure mechanical protection, these wires may be configured in such a way as to be insulated from one another. For many applications, a particularly stable, fully closed insulation is required which suppresses any flow of current, even in a moist environment.

Nowadays, standard methods of semiconductor technology exist for producing electrical microcomponents. The production of electrically stably insulated wires is also state of the art, for example in the production of wires for high-frequency technology which may comprise diameters of less than 20 µm and which are able to be produced inexpensively from copper, and thus also have a very high conductivity. At present, however, no method exists which allows the reproducible, inexpensive contacting of stably insulated, inexpensive wires on microcomponents. This problem is solved for the first time by the method of the present disclosure.

In order to electrically contact insulated wires, a region which is not insulated but which is instead easily able to be electrically contacted has to be provided at the contact point. One known contacting method which is used in microengineering is ultrasonic wire bonding, which represents the standard for the cold welding of microwires. It is used more rarely for contacting microwires with lengths greater than 60 centimeters, since the wire feed generally takes place through a very thin capillary which is not optimized for the pulling of the wire. In general, wire bonding is used for short contacting distances from the chip to the chip carrier. More recent efforts are aimed at the bonding of electrically insulated wires. This results from the increasingly small contact spacings and the lower bending stiffness of thinner wires, so that short-circuits could occur due to a component falling over before plastic has been injected around it. The mechanical stability of the insulating material used for these bondable wires is configured such that it is easily able to be penetrated by the bonding tool. Alternatively, the insulation is able to be removed or largely damaged by flaming it off the wire, and a contact is able to be established by bonding. Furthermore, the insulation only has to insulate a contact point with surface areas in the range of a few square nanometers, namely the area of two randomly overlapping wires, and under an extremely low mechanical load. These bonding methods are therefore not suitable for contacting inexpensive, stably insulated copper wires on microcomponents. A further increase in the bonding energy, as proposed in DE 16905038 A1, may lead to the component being destroyed and is often not suitable for sensitive semiconductor chips. A contacting of balls formed via flames or sparks, as proposed in DE 3642221 C2, is likewise not easy to carry out at present with copper wires and, due to the small process window, is not part of the frequently used state of the art. In both methods, there is the disadvantage that in each case the insulation has to be removed in a defined manner by applying energy without destroying the wire or the chip. With the stable insulations required for this and the precision of the required contact point, this is hardly ever possible and residues of the insulation remain in the contact region. The currently available wires which would be suitable for microcontacting do not comprise the necessary stability in terms of the mechanical abrasion resistance of the insulation, do not have a fully closed and therefore waterproof insulation, and are too expensive. The metals used are designed for contacting by means of ultrasonic bonding and thus comprise a ductility which opposes a tensile strength of the wire that is as high as possible, though the latter is nevertheless desirable and necessary for easy and inexpensive handling of long microwires.

Another method for contacting electrical wires on microcomponents is electrically conductive gluing. In this case, the surfaces of the contact point are finished (e.g. with a gold coating) in order to obtain a low transfer resistance which is stable for a long time. The dosing of the gluing or soldering auxiliary in the nanoliter range is the difficult part of this process. Application by means of microdispensers is very complicated since an alignment with each contact is necessary. Another possibility would be to apply the contact auxiliary to the wire end which is to be contacted. However, due to adhesion forces, the contact auxiliary usually spreads a little along the wire, meaning that not enough contact aid remains in the actual contact region.

Furthermore, it is difficult to create a defined contact region at the wire end. Possibilities include the use of finished and insulated copper wires or other finished metal wires. These are cost-intensive in terms of the basic price due to the high content of noble metal in the coating and base material and the low margins for special applications. In addition, a necessary removal of the insulation in the contact region in turn requires a very precise individual manipulation. For instance, the wire underneath the insulation could be exposed by means of a microblade, laser ablation or the application of local heat or of solvent. This is complicated and cost-intensive and, particularly in the micro range, is extremely difficult to carry out and is a source of error. For example, EP 1 396 915 A1 describes a method for stripping insulation from cable bundles by means of two different laser sources. In this case, the first insulation step is to be carried out using a long-wave laser so that a material thickness in the micrometer range remains, which in turn is removed using a short-wave laser. These methods are complicated and it is difficult to achieve a stripping of the insulation to micrometer accuracy along the length of the wire, and the insulation has to be suitable for laser machining, accordingly, and has to be available in a homogeneous thickness.

A defined contact region is also able to be created by weakening the insulation, thus generating a predetermined breaking point, and exposing a defined wire region by shifting the insulation to one side and then coating said wire region, as disclosed in DE 33 12 190 C1. With a required stable insulation on an individual conductor, this cannot be used or can be used only to a very limited extent since a very adhesive coating cannot be shifted. Furthermore, the positioning, which is accurate to within a few micrometers and is achieved by shifting the insulation, can only definitely be achieved with extreme difficulty due to the necessary micromanipulators and therefore cannot reasonably be used.

The methods from the state of the art are therefore not suitable for creating a precisely defined contact region on the micrometer scale, the production of which is virtually independent of the parameters of the insulation. Moreover, they do not solve the problem of dosing a contact auxiliary onto a noble contact system at the wire tip in the same working process and with the same accuracy as disclosed below.

GENERAL DESCRIPTION

A method according to the disclosure solves the problem of producing the non-insulated region in a defined manner; it makes it possible to produce suitable surface layers in this contact region and thus reduces the use of noble metal to a minimum. At the same time, it allows the contact auxiliary to be dosed and applied in a simple manner, in the same positioning step that also has to be used for aligning the wires for contacting. It allows a stable insulation optimized for the application to be chosen, regardless of the type of contacting. It allows inexpensive and mechanically stable standard wires to be used, for example copper wires from the field of high-frequency technology.

The following problems are solved by the method:
Inexpensive production of a microstructured, defined contact region, the dimensions of which are able to be controlled in the sub-micrometer range,
production of a defined contact material system with minimum use of material,
very good dosing and application of a contact auxiliary (glue, solder, etc.),
reduction in the number of adjustment steps.

In particular, the method solves the electrical contacting of microsensors to a thin elongated device such as a guide wire or catheter. However, it is also able to be used advantageously for further applications in the field of contacting microcomponents with long, insulated wires, in which the criteria of high insulation resistance and low price of the wire are important requirements.

Thin wires with mechanically stable, fully closed, "pinhole-free" insulation have long been the state of the art in the field of high-frequency technology and are very inexpensive due to the high purchase quantities. These wires are primarily optimized for minimum diameters with thicknesses of approx. 20 µm and a high tensile strength, the latter to ensure stable processes during processing. They are made from very inexpensive copper or copper alloys which simultaneously comprises a high tensile strength and a low specific resistance.

In the simplest and most advantageous case, the method according to the disclosure uses these wires. By cutting the wires with a sharp tool, a defined cut edge with a diameter of approx. 20 µm is obtained in the case of standard wire thicknesses. Immediately after the cut has been made, nickel is deposited, preferably galvanically from a nickel sulfamate bath, onto this freshly created cross-sectional surface. The rate of deposition is able to be adjusted by adjusting the current intensity, and the nickel thickness is able to be adjusted by adjusting the coating time. The nickel layer is able to be made very thin. A coating of the copper wire then takes place only on the front face and a little way below the insulation. Very small contact areas are therefore able to be produced. In the present application, however, a somewhat greater quantity of nickel is deposited so that a ball-shaped or mushroom-shaped deposit (bump) forms at the wire tip (cf. FIGS. 2$a$+$b$). In a further step, this ball is selectively coated with gold, either in an electroless manner or galvanically. Alternative coating systems, e.g. tin layers in combination with silver, are also able to be used. Due to the insulation which still exists on the wire, only the deposited ball is coated with gold. As a result of this, the use of noble metal is limited to a necessary minimum. The process can preferably be carried out in a panelized manner, i.e. a plurality of wires can be processed at the same time, and these panels can also be further processed rapidly in series.

Contacting takes place after rinsing the wires. For this, the wires are roughly pre-positioned above the component and the preferably liquid solder auxiliary is applied to the contact coating by means of a tool, in the simplest case a pin. Due to the arrangement as a ball-shaped or mushroom-shaped deposit, the solder auxiliary only spreads along the deposit created, as a result of which the quantity of contact auxiliary is limited in a simple manner and set in a defined manner via the size of the deposit. In contrast to instances where normal straight wires are used, the contact auxiliary is therefore located directly at the contact point. By joining the wire end and the contact point of the component, the contact auxiliary also spreads from the ball onto the contact area of the component. The contacting is thus established. Depending on the substances used and the subsequent processes, a heating of the contact substance may be necessary, for example by applying heat below the component. A subsequent gluing of the wire contacting to the component by means of a non-conductive glue may be useful for increased mechanical and electrical stability of the contacting.

With a further highly efficient contacting technique, the contact auxiliary is not used and the contacting is carried out directly by means of cold welding (wire bonding technique) or by means of hot welding using current-based, laser-based or percussion welding methods.

Possible variations in the process are the treatment of the cut edge by means of dilute sulfuric acid and hydrogen peroxide in order to increase the adhesive strength of the deposit and create an optimized surface when the time between the cutting and the first coating is longer than five minutes. Further variations include replacing the galvanic coating with a chemical coating, which is not as simple to monitor during the process, but does not require the electrical contacting of the wire end that is not to be coated. Further variations in the process, which are generally not necessary, may take place by optimizing the cut edge (this maybe formed at an angle, by way of example), by grinding in a holder, or by simply scarifying the insulation. Although nickel allows particular advantages in terms of the adhesion to copper, suppressing the diffusion of copper into gold and simple stable process control, the process described by way of example is nevertheless not limited to the aforementioned material components, and other galvanic or chemical coating systems are able to be used.

The method thus offers particular advantages due to a defined structure and in addition a particularly simple dosing of the auxiliary, i.e. glue or solder. Since the contact point is able to be selectively modified, the conducting wire, the insulation and the contact area are able to be optimized individually. Insulated wires with inexpensive but stable insulation are thus able to be produced and can be contacted with microcontacts for the first time since no defined contact region is able to be created in the case of stable insulations.

Some types of contacting in which electrically conductive layers are grown on or ball-shaped structures are used for contacting are known in the state of the art.

For instance, GB 1024540 describes a possibility for fixing conductive pins in non-conductive substrates under the effect of heat. This application does not address the ability to be microstructured and the creation of defined contact areas on insulated wires.

DE 195 35 282 A1 describes the creation of discrete contact areas by means of chemical deposition of metals. It does not address the creation of an electrical contact area on an insulated wire.

Further publications which describe contacting via ball-like structures relate, by way of example, to the connection of two components or of one component to a circuit board, e.g. contacting by means of elastic ball-shaped structures disclosed in JP 11031541 A.

None of the previous publications disclose solutions for creating a microstructured contact area on a stably insulated wire.

BRIEF DESCRIPTION OF THE DRAWINGS

Further advantages, features and properties of the disclosure will become clear from the following description of preferred embodiments of the disclosure with reference to the appended drawings.

DETAILED DESCRIPTION OF THE DRAWINGS

Figure 1:
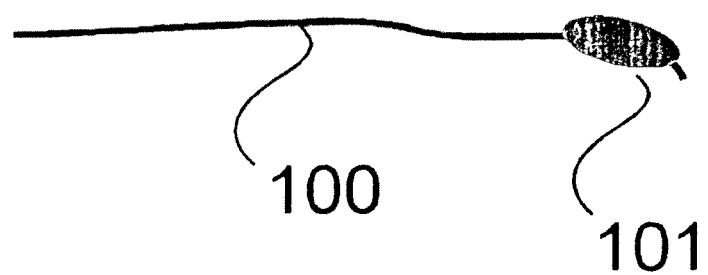
FIG. 1 is the view of a conventional wire with insulation and applied contact auxiliary.

When contacting wires (100) using liquid contact auxiliary (101) such as solder or glue the said contact auxiliary does not adhere to the contact point on the front face of the wire in the case of standard wires; rather, it migrates slightly along the wire due to adhesion and cohesion forces and accumulates at a small distance from the front face of the wire, as shown in FIG. 1. The quantity of this glue is usually unspecific and is too much for contacting. Moreover, the front face of the wire generally does not offer sufficient surface area for a stable electrical and mechanical contacting.

Figure 2:
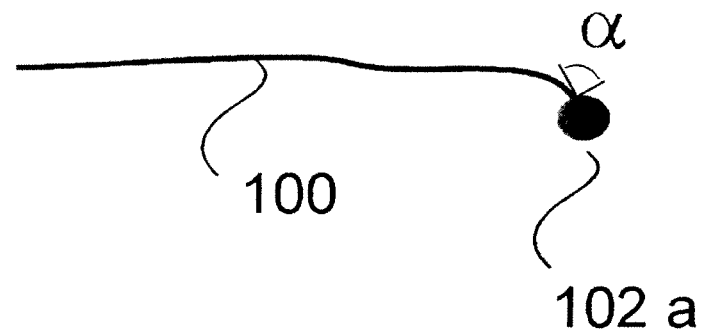
FIG. 2a is the view of a wire according to the present disclosure with insulation and a contact region deposited in a ball shape.
FIG. 2b is the view of a wire according to the present disclosure with insulation and a contact region deposited in a mushroom shape or other shape.
Figure 2B:
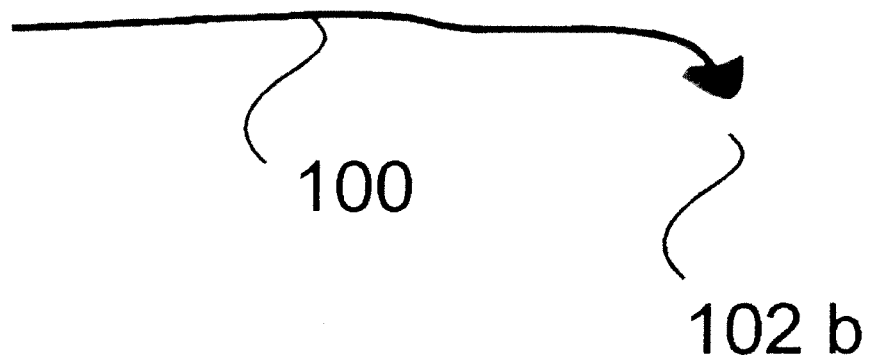

By depositing a coating (102a) as shown in FIG. 2, a wire according to the present disclosure is able to be created from a simple wire. Said wire is machined on the front face by cutting, grinding or the like. A ball-shaped, conductive deposit then adheres thereto by being grown thereon. Alternatively, this deposit may be shaped in a mushroom-like or other manner, as represented in FIG. 2b. Very short coating times allow a finishing of the wire; longer coating times produce special flow stop edges oriented at an angle α for the dosing of the contact auxiliary (101), which prevent the contact auxiliary from spreading along the insulated wire but rather cause it to remain in the contact region.

Figure 3:
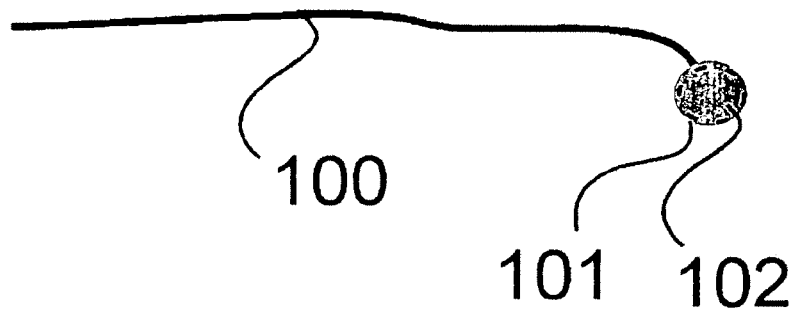
FIG. 3 shows the improved coating, with contact auxiliary, of the deposit at the contact point of the wire according to the present disclosure.

As a result, the contact auxiliary (101) spreads only along the deposit (102), as shown in FIG. 3, and not along the wire (100), as shown in FIG. 1. By varying the size of the deposit (102), the quantity of glue to be applied is able to be dosed in a simple manner. Further parameters for dosing the glue include the ratio of the surface activity of the outer coating of the deposit and of the contact auxiliary, and the surface tension and viscosity of the contact auxiliary. For a selected material system, however, the latter parameters remain constant, meaning that the quantity of applied contact auxiliary (101) is able to be controlled in a simple manner via the size of the deposit (102) during the process.

Figure 4:
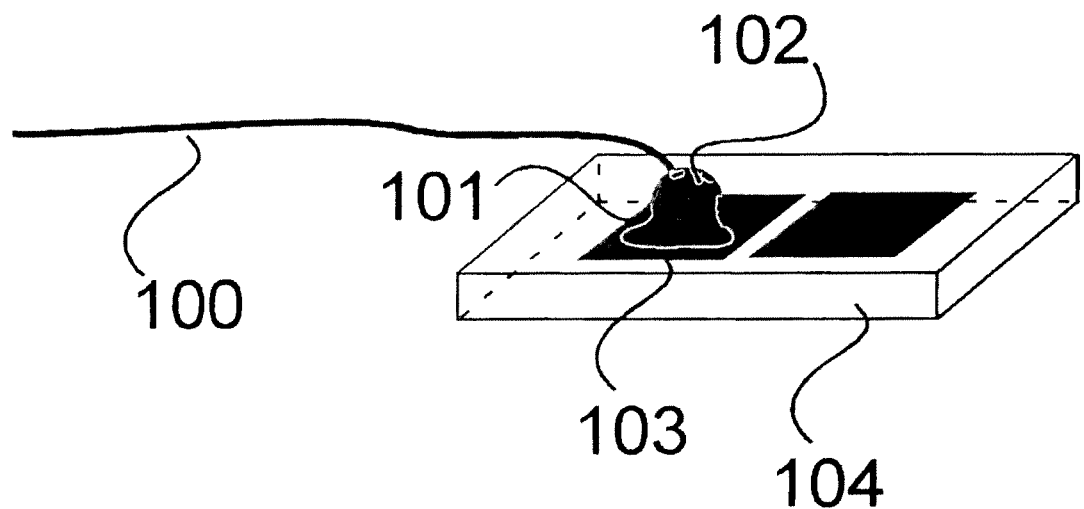
FIG. 4a shows a contacting of a component by means of a wire according to the present disclosure and contact auxiliary.
FIG. 4b shows a contacting of a component by means of a wire according to the present disclosure without contact auxiliary.
Figure 4:
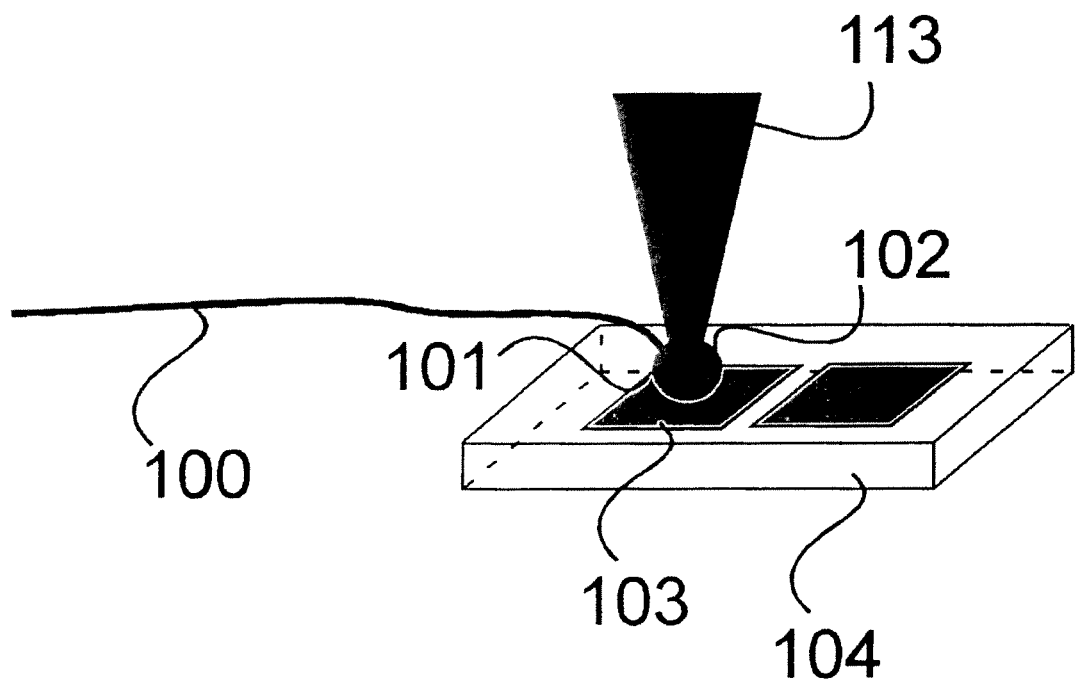

FIG. 4a shows a contacting using the wire according to the disclosure. By bringing the deposit (102) into contact with the contact auxiliary, the latter spreads along the deposit with a defined quantity. The dosing of the contact auxiliary thus takes place in a very simple manner. When the contact auxiliary is applied to the deposit, the contact region can be brought into contact with the second contact surface and a defined quantity of contact auxiliary spreads from the deposit (101) onto the contact surface (103) of the component (104), thus establishing the electrical contacting.

Another very advantageous type of contacting which is particularly possible with the wire according to the disclosure is the contacting without contact auxiliary by means of ultrasonic welding as shown in FIG. 4b. In this case, though a further positioning of the bonding tool (113) in addition to the wire is necessary, proven technologies can be applied to the contacting of stably insulated wires. Ultrasonic bonding technology is thus also able to be used on stably insulated wires.

Figure 5:
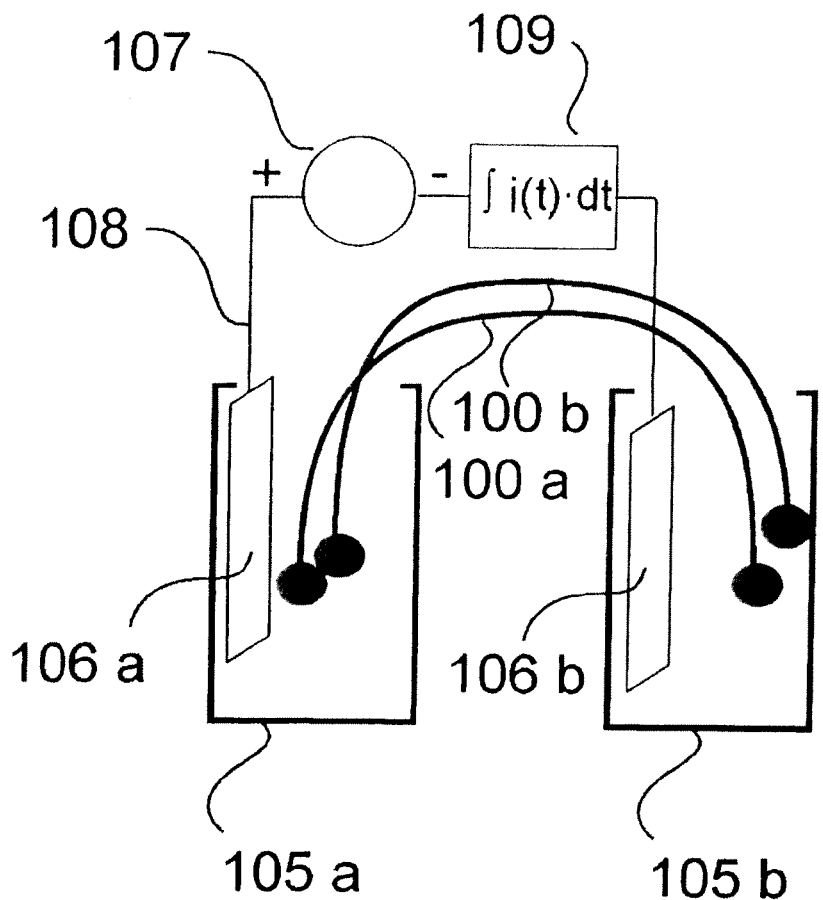
FIG. 5 is the sketch of a galvanic coating of the wire ends, which is also able to be used for coating both sides of one and more wires.

One preferred method of production is deposition by means of galvanic coating as shown in FIG. 5. In this case, the current intensity over time is able to be integrated by an integrator (109). The size of the deposit is thus able to be set very precisely via the charge that has flowed. Here, the front faces of the wire ends are exposed by an indicated method and are introduced into an electrolyte-filled container (105). The second wire end is electrically contacted, by way of example, via an electrical contact or, as shown in FIG. 5, via a second electrolytic contact. The latter simplifies the coating of microcables, which are difficult to contact. Alternatively, the deposit may also take place in a time-controlled and electroless manner via reductive chemical baths. In principle, the surface should be finished after the first deposition. This allows for long-term stable contacting with glue, prevents the oxidation for bonding, and allows for a setting of the quantity of glue based on the surface activity of the outer coating. The coatings may once again take place galvanically, chemically or simply by immersion in a solution of the substance to be coated.

Figure 6:
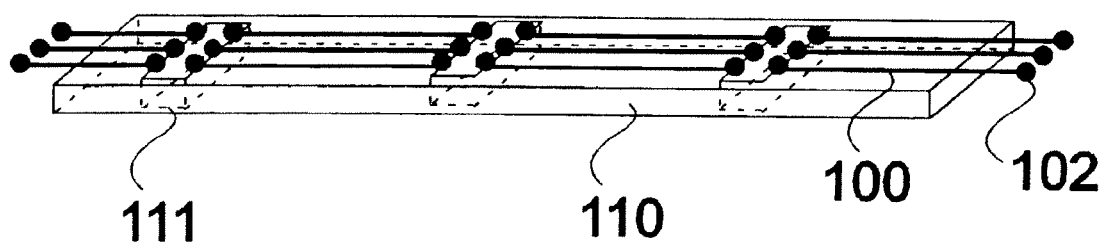
FIG. 6 shows a possibility for the automated manufacture of wires on a carrier strip.

FIG. 6 shows a basic method for manufacturing the wires according to the disclosure. A single wire or multitude of wires are attached to a carrier substrate (110). Formed in this substrate (for example by punching) are holes which expose electrically conductive areas of the wire. Alternatively, it is also sufficient simply to scarify or saw through the wire and only damage the carrier to a minimal extent. This allows for simple further processing.

The descriptions are provided as an explanation of the process and are able to be used in different combinations and variations.

Designation of the Invention

Method for Miniaturizable Contacting of Insulated Wires

Introduction

Insulated wires are often used when contacting electrical components. In many products, the trend toward miniaturizing components leads to large savings in terms of material. Due to the small dimensions, the miniaturized components can generally be produced in panelized form; a large number of components are therefore manufactured in parallel on a carrier, resulting in huge cost savings. However, miniaturization also primarily enables the development of new applications through miniaturized components and assemblies.

In medical technology, for example, blood pressure can be determined directly in the coronary vessels by means of very small sensors. Miniaturized actuators are also suitable to be used for transmitting and in turn receiving sound waves in the coronary vessels. Thus, the flow rate of the blood is able to be determined via the shift in frequency. In addition, during catheterization, the reaction force of instruments in the coronary vessels is able to be measured by means of miniaturized force sensors. Further uses of miniaturized electrical components can be found in the aerospace industry, motor vehicle engineering, building services engineering, and the consumer goods industry, as well as in almost all areas of technology in the future.

Microsensors often have to be supplied with energy, and the signals have to be conducted over several meters. For that purpose, electrical wires, often microcables, are advantageously used, particularly in the case of connection lengths greater than 60 cm. In order to protect these wires from short-circuiting with one another and from external influences and to ensure mechanical protection, these wires may be configured in such a way as to be insulated from one another. For many applications, a particularly stable, fully closed insulation is required which suppresses any flow of current, even in a moist environment.

State of the Art

Nowadays, standard methods of semiconductor technology exist for producing electrical microcomponents. The production of electrically stably insulated wires is also state of the art, for example in the production of wires for high-frequency technology which may comprise diameters of less than 20 μm and which are able to be produced inexpensively from copper, and thus also have a very high conductivity. At present, however, no method exists which allows the reproducible, inexpensive contacting of stably insulated, inexpensive wires on microcomponents. This problem is solved for the first time by the method of the present invention.

In order to electrically contact insulated wires, a region which is not insulated but which is instead easily able to be electrically contacted has to be provided at the contact point.

One known contacting method which is used in microengineering is ultrasonic wire bonding, which represents the standard for the cold welding of microwires. It is used more rarely for contacting microwires with lengths greater than 60 centimeters, since the wire feed generally takes place through a very thin capillary which is not optimized for the pulling of the wire. In general, wire bonding is used for short contacting distances from the chip to the chip carrier. More recent efforts are aimed at the bonding of electrically insulated wires. This results from the increasingly small contact spacings and the lower bending stiffness of thinner wires, so that short-circuits could occur due to a component falling over before plastic has been injected around it. The mechanical stability of the insulating material used for these bondable wires is configured such that it is easily able to be penetrated by the bonding tool. Alternatively, the insulation is able to be removed or largely damaged by flaming it off the wire, and a contact is able to be established by bonding. Furthermore, the insulation only has to insulate a contact point with surface areas in the range of a few square nanometers, namely the area of two randomly overlapping wires, and under an extremely low mechanical load. These bonding methods are therefore not suitable for contacting inexpensive, stably insulated copper wires on microcomponents. A further increase in the bonding energy, as proposed in DE 16905038 A1, may lead to the component being destroyed and is often not suitable for sensitive semiconductor chips. A contacting of balls formed via flames or sparks, as proposed in DE 3642221 C2, is likewise not easy to carry out at present with copper wires and, due to the small process window, is not part of the frequently used state of the art. In both methods, there is the disadvantage that in each case the insulation has to be removed in a defined manner by applying energy without destroying the wire or the chip. With the stable insulations required for this and the precision of the required contact point, this is hardly ever possible and residues of the insulation remain in the contact region. The currently available wires which would be suitable for microcontacting do not comprise the necessary stability in terms of the mechanical abrasion resistance of the insulation, do not have a fully closed and therefore waterproof insulation, and are too expensive. The metals used are designed for contacting by means of ultrasonic bonding and thus comprise a ductility which opposes a tensile strength of the wire that is as high as possible, though the latter is nevertheless desirable and necessary for easy and inexpensive handling of long microwires.

Another method for contacting electrical wires on microcomponents is electrically conductive gluing. In this case, the surfaces of the contact point are finished (e.g. with a gold coating) in order to obtain a low transfer resistance which is stable for a long time. The dosing of the gluing or soldering auxiliary in the nanoliter range is the difficult part of this process. Application by means of microdispensers is very complicated since an alignment with each contact is necessary. Another possibility would be to apply the contact auxiliary to the wire end which is to be contacted. However, due to adhesion forces, the contact auxiliary usually spreads a little along the wire, meaning that not enough contact aid remains in the actual contact region.

Furthermore, it is difficult to create a defined contact region at the wire end. Possibilities include the use of finished and insulated copper wires or other finished metal wires. These are cost-intensive in terms of the basic price due to the high content of noble metal in the coating and base material and the low margins for special applications. In addition, a necessary removal of the insulation in the contact region in turn requires a very precise individual manipulation. For instance, the wire underneath the insulation could be exposed by means of a microblade, laser ablation or the application of local heat or of solvent. This is complicated and cost-intensive and, particularly in the micro range, is extremely difficult to carry out and is a source of error. For example, EP 1 396 915 A1 describes a method for stripping insulation from cable bundles by means of two different laser sources. In this case, the first insulation step is to be carried out using a long-wave laser so that a material thickness in the micrometer range remains, which in turn is removed using a short-wave laser. These methods are complicated and it is difficult to achieve a stripping of the insulation to micrometer accuracy along the length of the wire, and the insulation has to be suitable for laser machining, accordingly, and has to be available in a homogeneous thickness.

A defined contact region is also able to be created by weakening the insulation, thus generating a predetermined breaking point, and exposing a defined wire region by shifting the insulation to one side and then coating said wire region, as disclosed in DE 33 12 190 C1. With a required stable insulation on an individual conductor, this cannot be used or can be used only to a very limited extent since a very adhesive coating cannot be shifted. Furthermore, the positioning, which is accurate to within a few micrometers and is achieved by shifting the insulation, can only definitely be achieved with extreme difficulty due to the necessary micromanipulators and therefore cannot reasonably be used.

The methods from the state of the art are therefore not suitable for creating a precisely defined contact region on the micrometer scale, the production of which is virtually independent of the parameters of the insulation. Moreover, they do not solve the problem of dosing a contact auxiliary onto a noble contact system at the wire tip in the same working process and with the same accuracy as disclosed below.

Advantages of the Invention

The method according to the invention solves the problem of producing the non-insulated region in a defined manner; it makes it possible to produce suitable surface layers in this contact region and thus reduces the use of noble metal to a minimum. At the same time, it allows the contact auxiliary to be dosed and applied in a simple manner, in the same positioning step that also has to be used for aligning the wires for contacting. It allows a stable insulation optimized for the application to be chosen, regardless of the type of contacting. It allows inexpensive and mechanically stable standard wires to be used, for example copper wires from the field of high-frequency technology.

The following problems are solved by the method:
Inexpensive production of a microstructured, defined contact region, the dimensions of which are able to be controlled in the sub-micrometer range,
production of a defined contact material system with minimum use of material,
very good dosing and application of a contact auxiliary (glue, solder, etc.),
reduction in the number of adjustment steps.

In particular, the method solves the electrical contacting of microsensors to a thin elongated device such as a guide wire or catheter. However, it is also able to be used advantageously for further applications in the field of contacting microcomponents with long, insulated wires, in which the criteria of high insulation resistance and low price of the wire are important requirements.

Solution to the Problem

Thin wires with mechanically stable, fully closed, "pinhole-free" insulation have long been the state of the art in the field of high-frequency technology and are very inexpensive due to the high purchase quantities. These wires are primarily optimized for minimum diameters with thicknesses of approx. 20 µm and a high tensile strength, the latter to ensure stable processes during processing. They are made from very inexpensive copper or copper alloys which simultaneously comprises a high tensile strength and a low specific resistance.

In the simplest and most advantageous case, the method according to the invention uses these wires. By cutting the wires with a sharp tool, a defined cut edge with a diameter of approx. 20 µm is obtained in the case of standard wire thicknesses. Immediately after the cut has been made, nickel is deposited, preferably galvanically from a nickel sulfamate bath, onto this freshly created cross-sectional surface. The rate of deposition is able to be adjusted by adjusting the current intensity, and the nickel thickness is able to be adjusted by adjusting the coating time. The nickel layer is able to be made very thin. A coating of the copper wire then takes place only on the front face and a little way below the insulation. Very small contact areas are therefore able to be produced. In the present application, however, a somewhat greater quantity of nickel is deposited so that a ball-shaped or mushroom-shaped deposit (bump) forms at the wire tip (cf. FIGS. 2a+b). In a further step, this ball is selectively coated with gold, either in an electroless manner or galvanically. Alternative coating systems, e.g. tin layers in combination with silver, are also able to be used. Due to the insulation which still exists on the wire, only the deposited ball is coated with gold. As a result of this, the use of noble metal is limited to a necessary minimum. The process can preferably be carried out in a panelized manner, i.e. a plurality of wires can be processed at the same time, and these panels can also be further processed rapidly in series.

Contacting takes place after rinsing the wires. For this, the wires are roughly pre-positioned above the component and the preferably liquid solder auxiliary is applied to the contact coating by means of a tool, in the simplest case a pin. Due to the arrangement as a ball-shaped or mushroom-shaped deposit, the solder auxiliary only spreads along the deposit created, as a result of which the quantity of contact auxiliary is limited in a simple manner and set in a defined manner via the size of the deposit. In contrast to instances where normal straight wires are used, the contact auxiliary is therefore located directly at the contact point. By joining the wire end and the contact point of the component, the contact auxiliary also spreads from the ball onto the contact area of the component. The contacting is thus established. Depending on the substances used and the subsequent processes, a heating of the contact substance may be necessary, for example by applying heat below the component. A subsequent gluing of the wire contacting to the component by means of a non-conductive glue may be useful for increased mechanical and electrical stability of the contacting.

With a further highly efficient contacting technique, the contact auxiliary is not used and the contacting is carried out directly by means of cold welding (wire bonding technique) or by means of hot welding using current-based, laser-based or percussion welding methods.

Possible variations in the process are the treatment of the cut edge by means of dilute sulfuric acid and hydrogen peroxide in order to increase the adhesive strength of the deposit and create an optimized surface when the time between the cutting and the first coating is longer than five minutes. Further variations include replacing the galvanic coating with a chemical coating, which is not as simple to monitor during the process, but does not require the electrical contacting of the wire end that is not to be coated. Further variations in the process, which are generally not necessary, may take place by optimizing the cut edge (this maybe formed at an angle, by way of example), by grinding in a holder, or by simply scarifying the insulation. Although nickel allows particular advantages in terms of the adhesion to copper, suppressing the diffusion of copper into gold and simple stable process control, the process described by way of example is nevertheless not limited to the aforementioned material components, and other galvanic or chemical coating systems are able to be used.

The method thus offers particular advantages due to a defined structure and in addition a particularly simple dosing of the auxiliary, i.e. glue or solder. Since the contact point is able to be selectively modified, the conducting wire, the insulation and the contact area are able to be optimized individually. Insulated wires with inexpensive but stable insulation are thus able to be produced and can be contacted with microcontacts for the first time since no defined contact region is able to be created in the case of stable insulations.

Some types of contacting in which electrically conductive layers are grown on or ball-shaped structures are used for contacting are known in the state of the art.

For instance, GB 1024540 describes a possibility for fixing conductive pins in non-conductive substrates under the effect of heat. This application does not address the ability to be microstructured and the creation of defined contact areas on insulated wires.

DE 195 35 282 A1 describes the creation of discrete contact areas by means of chemical deposition of metals. It does not address the creation of an electrical contact area on an insulated wire.

Further publications which describe contacting via ball-like structures relate, by way of example, to the connection of two components or of one component to a circuit board, e.g. contacting by means of elastic ball-shaped structures disclosed in JP 11031541 A.

None of the previous publications disclose solutions for creating a microstructured contact area on a stably insulated wire.

DESCRIPTION OF THE DRAWINGS, AND EMBODIMENTS

Further advantages, features and properties of the invention will become clear from the following description of preferred embodiments of the invention with reference to the appended drawings.

FIG. 1 is the view of a conventional wire with insulation and applied contact auxiliary.

FIG. 2a is the view of a wire according to the present invention with insulation and a contact region deposited in a ball shape.

FIG. 2b is the view of a wire according to the present invention with insulation and a contact region deposited in a mushroom shape or other shape.

FIG. 3 shows the improved coating, with contact auxiliary, of the deposit at the contact point of the wire according to the present invention.

FIG. 4a shows a contacting of a component by means of a wire according to the present invention and contact auxiliary.

FIG. 4b shows a contacting of a component by means of a wire according to the present invention without contact auxiliary.

FIG. 5 is the sketch of a galvanic coating of the wire ends, which is also able to be used for coating both sides of one and more wires.

FIG. 6 shows a possibility for the automated manufacture of wires on a carrier strip.

When contacting wires (100) using liquid contact auxiliary (101) such as solder or glue the said contact auxiliary does not adhere to the contact point on the front face of the wire in the case of standard wires; rather, it migrates slightly along the wire due to adhesion and cohesion forces and accumulates at a small distance from the front face of the wire, as shown in FIG. 1. The quantity of this glue is usually unspecific and is too much for contacting. Moreover, the front face of the wire generally does not offer sufficient surface area for a stable electrical and mechanical contacting.

By depositing a coating (102a) as shown in FIG. 2, a wire according to the present invention is able to be created from a simple wire. Said wire is machined on the front face by cutting, grinding or the like. A ball-shaped, conductive deposit then adheres thereto by being grown thereon. Alternatively, this deposit may be shaped in a mushroom-like or other manner, as represented in FIG. 2b. Very short coating times allow a finishing of the wire; longer coating times produce special flow stop edges oriented at an angle α for the dosing of the contact auxiliary (101), which prevent the contact auxiliary from spreading along the insulated wire but rather cause it to remain in the contact region.

As a result, the contact auxiliary (101) spreads only along the deposit (102), as shown in FIG. 3, and not along the wire (100), as shown in FIG. 1. By varying the size of the deposit (102), the quantity of glue to be applied is able to be dosed in a simple manner. Further parameters for dosing the glue include the ratio of the surface activity of the outer coating of the deposit and of the contact auxiliary, and the surface tension and viscosity of the contact auxiliary. For a selected material system, however, the latter parameters remain constant, meaning that the quantity of applied contact auxiliary (101) is able to be controlled in a simple manner via the size of the deposit (102) during the process.

FIG. 4a shows a contacting using the wire according to the invention. By bringing the deposit (102) into contact with the contact auxiliary, the latter spreads along the deposit with a defined quantity. The dosing of the contact auxiliary thus takes place in a very simple manner. When the contact auxiliary is applied to the deposit, the contact region can be brought into contact with the second contact surface and a defined quantity of contact auxiliary spreads from the deposit (101) onto the contact surface (103) of the component (104), thus establishing the electrical contacting.

Another very advantageous type of contacting which is particularly possible with the wire according to the invention is the contacting without contact auxiliary by means of ultrasonic welding as shown in FIG. 4b. In this case, though a further positioning of the bonding tool (113) in addition to the wire is necessary, proven technologies can be applied to the contacting of stably insulated wires. Ultrasonic bonding technology is thus also able to be used on stably insulated wires.

One preferred method of production is deposition by means of galvanic coating as shown in FIG. 5. In this case, the current intensity over time is able to be integrated by an integrator (109). The size of the deposit is thus able to be set very precisely via the charge that has flowed. Here, the front faces of the wire ends are exposed by an indicated method and are introduced into an electrolyte-filled container (105). The second wire end is electrically contacted, by way of example, via an electrical contact or, as shown in FIG. 5, via a second electrolytic contact. The latter simplifies the coating of microcables, which are difficult to contact. Alternatively, the deposit may also take place in a time-controlled and electroless manner via reductive chemical baths. In principle, the surface should be finished after the first deposition. This allows for long-term stable contacting with glue, prevents the oxidation for bonding, and allows for a setting of the quantity of glue based on the surface activity of the outer coating. The coatings may once again take place galvanically, chemically or simply by immersion in a solution of the substance to be coated.

FIG. 6 shows a basic method for manufacturing the wires according to the invention. A single wire or multitude of wires are attached to a carrier substrate (110). Formed in this substrate (for example by punching) are holes which expose electrically conductive areas of the wire. Alternatively, it is also sufficient simply to scarify or saw through the wire and only damage the carrier to a minimal extent. This allows for simple further processing.

The descriptions are provided as an explanation of the process and are able to be used in different combinations and variations.

LIST OF REFERENCE NUMERALS 100 insulated wire
101 contact auxiliary
102a+b grown-on, conductive deposit
103 connection surface of the component
104 component (microchip, etc.)
105a+b vessel containing electrolyte
106a+b electrodes in the electrolyte
107 current or voltage source
108 electrical conductor
109 integrator
110 carrier
111 punched hole in the carrier
112 coil
113 bonding tool
α angle between the coating and the longitudinal axis of the wire

The invention claimed is:

1. A method for contacting single insulated electrical wires, comprising forming a cross-sectional front surface on a single insulated electrical wire by cutting, the single insulated electrical wire having a wire of alloy components and an insulation, and applying a ball-shaped or mushroom-shaped coating to the cross-sectional front surface by means of a coating process which takes place at temperatures below a melting temperature of the alloy components and below a temperature at which the insulation is destroyed, so that a defined contact region is formed by the coating on the wire and the wire comprises an enlarged diameter at the contact area due to the coating, whereas the coating extends over the insulated electrical wire and forms a flow stop edge at an angle a relative to the insulated electrical wire.

2. The method according to claim 1, wherein the cross-sectional front surface is exposed or formed by varying a cutting angle of a cutting tool or by crushing the wire to create an electrically conductive surface which is smaller than, equal to, or larger than the previous cross-sectional surface of the wire.

3. The method according to claim 1, wherein the coating of the cross-section front surface takes place electrochemically by galvanic coating, chemically reductive coating, immersion, or a combination of these methods.

4. The method according to claim 1, wherein the coating of the contact area comprises an increased surface roughness and an adapted surface activity.

5. The method according to claim 1, wherein the contacting of the wire with a component takes place by means of a contact auxiliary.

6. The method according to claim 1, wherein the contacting of the wire with a component takes place without contact auxiliary by means of welding methods.

7. The method according to claim 1, wherein one or more wires are processed simultaneously on a carrier.

8. The method according to claim 1, wherein one or more wires are processed simultaneously without a carrier.

9. The method according to claim 1, wherein the insulation is removed after processing and uninsulated wires with a very precisely defined contact region are able to be used.

10. The method according to claim 4, further comprising generating the increased surface roughness and the adapted surface activity of the coating of the contact area by self-enhancing tip growth due to electrostatic field magnification at tips, electrochemical roughening or a hydrophilic or hydrophobic additional coating in order to simplify a dosing of a contact auxiliary.

11. The method according to claim 5, wherein the contact auxiliary comprises solder or electrically conductive glue.

12. The method according to claim 6, wherein the welding methods include ultrasonic welding—bonding—or laser welding.

* * * * *